(12) United States Patent
Schwandner

(10) Patent No.: US 8,343,873 B2
(45) Date of Patent: Jan. 1, 2013

(54) METHOD FOR PRODUCING A SEMICONDUCTOR WAFER

(75) Inventor: Juergen Schwandner, Garching (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 13/392,151

(22) PCT Filed: Aug. 11, 2010

(86) PCT No.: PCT/EP2010/004916
§ 371 (c)(1),
(2), (4) Date: Feb. 24, 2012

(87) PCT Pub. No.: WO2011/023297
PCT Pub. Date: Mar. 3, 2011

(65) Prior Publication Data
US 2012/0149198 A1    Jun. 14, 2012

(30) Foreign Application Priority Data
Aug. 26, 2009   (DE) .................. 10 2009 038 941

(51) Int. Cl.
*H01L 21/302* (2006.01)

(52) U.S. Cl. ............. 438/692; 216/83; 216/88; 216/89; 216/91; 216/96; 216/99; 438/689; 438/690; 438/691; 438/693; 438/753

(58) Field of Classification Search .................. None
See application file for complete search history.

(56) References Cited

U.S. PATENT DOCUMENTS

| | | |
|---|---|---|
| 3,905,162 A | 9/1975 | Lawrence et al. |
| 4,655,191 A | 4/1987 | Wells et al. |
| 5,287,774 A | 2/1994 | Seifert |
| 5,400,548 A | 3/1995 | Huber et al. |
| 5,942,445 A | 8/1999 | Kato et al. |
| 5,989,105 A | 11/1999 | Kawakawaguchi et al. |
| 6,007,407 A | 12/1999 | Rutherford et al. |
| 6,299,514 B1 | 10/2001 | Boller |
| 6,599,177 B2 | 7/2003 | Nevoret et al. |
| 6,602,117 B1 | 8/2003 | Chopra et al. |
| 2001/0001756 A1 * | 5/2001 | Somekh .............. 451/41 |
| 2002/0016072 A1 * | 2/2002 | Hashii et al. ........... 438/690 |
| 2002/0077039 A1 | 6/2002 | Wenski et al. |
| 2003/0022495 A1 | 1/2003 | Netsu et al. |
| 2005/0227590 A1 | 10/2005 | Sung |
| 2006/0258268 A1 | 11/2006 | Miyata et al. |
| 2008/0014839 A1 | 1/2008 | Pietsch et al. |
| 2008/0305722 A1 | 12/2008 | Roettger et al. |
| 2009/0029552 A1 | 1/2009 | Schwandner et al. |

FOREIGN PATENT DOCUMENTS

| | | |
|---|---|---|
| DE | 3942671 A1 | 6/1991 |
| DE | 10007390 A1 | 10/2000 |
| DE | 10344602 A1 | 5/2005 |
| DE | 102006032455 A1 | 4/2008 |
| DE | 102007035266 A1 | 1/2009 |
| EP | 0522542 A1 | 1/1993 |
| EP | 0955126 B1 | 10/2002 |
| JP | 2000280155 A | 10/2000 |
| JP | 2002307303 A | 10/2002 |
| WO | WO 9213680 A1 | 8/1992 |
| WO | WO 9955491 A1 | 11/1999 |

OTHER PUBLICATIONS

Z.J. Pei et al., "Grinding of silicon wafers: A review from historical perspectives", International Journal of Machine Tools & Manufacture, vol. 48, 2008, pp. 1297-1307.*

* cited by examiner

*Primary Examiner* — Lan Vinh
*Assistant Examiner* — Jiong-Ping Lu
(74) *Attorney, Agent, or Firm* — Leydig, Voit & Mayer, Ltd.

(57) ABSTRACT

A method for producing a semiconductor wafer includes a number of steps in order including a bilateral material-removing process followed by rounding off an edge of the wafer and grinding front and back sides of the wafer by holding one side and grinding the other. The front and back are then polished with a polishing cloth including bound abrasives and subsequently treated with an etching medium to carry out a material removal of no more than 1 μm on each side. The front side is then polished using a polishing cloth including bound abrasives and the back side is simultaneously polished using a polishing cloth free of abrasives while a polish with abrasives is provided. The edge is then polished followed by polishing the back with a polishing cloth including bound abrasives and simultaneously polishing the front with a cloth free of abrasives while a polish including abrasives is provided.

23 Claims, No Drawings

METHOD FOR PRODUCING A SEMICONDUCTOR WAFER

CROSS REFERENCE TO RELATED APPLICATIONS

This application is a U.S. National Phase application under 35 U.S.C. §371 of International Application No. PCT/EP2010/004916, filed on Aug. 11, 2010, and claims benefit to German Patent Application No. DE 10 2009 038 941.5, filed on Aug. 26, 2009. The International Application was published in German on Mar. 3, 2011 as WO 2011/023297 A1 under PCT Article 21 (2).

FIELD

The invention relates to a method for producing a semiconductor wafer.

BACKGROUND

According to the prior art, semiconductor wafers are produced in a large number of successive process steps which can generally be divided into the following groups:

a) production of a single crystal consisting of semiconductor material (crystal pulling);
b) separation of the semiconductor single crystal into individual wafers ("wafering", "slicing");
c) mechanical processing of the semiconductor wafers;
d) chemical processing of the semiconductor wafers;
e) chemo-mechanical processing of the semiconductor wafers;
f) thermal treatment of the semiconductor wafers and/or epitaxial coating of the semiconductor wafers.

In addition to this, there are a large number of secondary steps, such as cleaning, measuring and packaging.

A semiconductor single crystal is usually produced by pulling a single crystal out of a melt (CZ or "Czochralski" method) or by the recrystallisation of a rod of polycrystalline semiconductor material (FZ or "floating zone" method).

Wire sawing ("multi-wire slicing", MWS) and inner diameter sawing are known as cutting methods.

In wire sawing, a plurality of semiconductor wafers is cut off from a piece of crystal in one operation.

The purpose of mechanical processing is to remove sawing undulations, to remove the surface layers which have been crystal-damaged by the relatively rough sawing processes or have been contaminated by the sawing wire and in particular to comprehensively level the semiconductor wafers. Surface grinding (single-side, double-side) and lapping are known in this respect, as are mechanical edge processing steps.

In single-side grinding, the back of the semiconductor wafer is held on a support ("chuck") and the front is levelled by a cup wheel with the rotation of the chuck and grinding wheel and with a slow radial advance. Methods and devices for the surface grinding of a semiconductor wafer are known, for example from U.S. Pat. No. 3,905,162 and from U.S. Pat. No. 5,400,548 or from EP-0955126. In these documents, a semiconductor wafer is secured by one surface on a wafer holder, while the opposite surface is worked by a grinding wheel, in that the wafer holder and grinding wheel rotate and are pressed against one another. In this respect, the semiconductor wafer is attached on the wafer holder such that the centre thereof substantially coincides with the centre of rotation of the wafer holder. Furthermore, the grinding wheel is positioned such that the centre of rotation of the semiconductor wafer passes into a working region or into the peripheral region, formed by teeth, of the grinding wheel. As a result, the entire surface of the semiconductor wafer can be ground without any movement in the grinding plane.

In simultaneous double-side grinding ("double-disc grinding", DDG), the semiconductor wafer is simultaneously worked on both sides in a free-floating manner between two grinding wheels which are mounted on opposite collinear spindles and is guided axially in a manner, substantially free from constraining forces, between a water cushion (hydrostatic principle) or air cushion (aerostatic principle) which acts on the front and on the back and is prevented from floating away in a radially loose manner by a surrounding thin guide ring or by individual radial spokes.

In lapping, the semiconductor wafers are moved under a specific pressure between an upper and a lower working wheel which mostly consist of steel and are usually provided with channels for an improved distribution of the abrasives, with the supply of a suspension (slurry) containing abrasive substances, as a result of which semiconductor material is removed.

DE 103 44 602 A1 and DE 10 2006 032 455 A1 describe methods for simultaneously grinding both sides of a plurality of semiconductor wafers with a sequence of movements similar to that of lapping, but they are characterised in that an abrasive is used which is firmly bound into working layers ("films, cloths") applied onto the working wheels. A method of this type is termed "fine grinding with lap kinematics" or "planetary pad grinding" (PPG).

Working layers which are used in PPG and are bonded onto the two working wheels are described in, for example U.S. Pat. No. 6,007,407 A and U.S. Pat. No. 6,599,177 B2. During processing, the semiconductor wafers are introduced into thin guide cages, so-called runner wheels which have suitable openings for receiving the semiconductor wafers. The runner wheels have outer teeth which engage into a roll-off device consisting of an inner and an outer toothed ring and are moved by said roll-off device in the working gap formed between the upper and lower working wheel.

The edge of the semiconductor wafer including mechanical marks which may be present, such as an orientation notch, is usually also processed (edge rounding, "edge-notch-grinding"). Conventional grinding steps using profiled grinding wheels or belt grinding methods with continuous or periodic tool feed are used for this purpose. These edge rounding methods are used, since in the unworked state, the edge is particularly susceptible to breaking and the semiconductor wafer can be damaged by slight pressure and/or temperature loads in said edge region.

In a later processing step, the edge of the wafer which has been ground and treated with an etching medium is usually polished. In this respect, the edge of a centrally rotating semiconductor wafer is pressed against a centrally rotating polishing drum with a specific force (contact pressure). U.S. Pat. No. 5,989,105 discloses a method of this type for edge polishing in which the polishing drum consists of an aluminium alloy and is covered by a polishing cloth. The semiconductor wafer is usually fixed on a flat wafer holder, a so-called chuck. The edge of the semiconductor wafer projects over the chuck, so that it is freely accessible to the polishing drum.

The group of chemical processing steps usually includes wet-chemical cleaning and etching steps.

The group of chemo-mechanical processing steps includes polishing steps, by which the surface is smoothed partly by a chemical reaction and partly by a mechanical material removal (abrasion), and residual damage to the surface is removed.

Whereas single-side polishing methods ("single-side polishing") usually result in relatively poor plane parallelisms, bilaterally engaging polishing methods ("double-side polishing") produce semiconductor wafers with an improved evenness.

After the grinding, cleaning and etching steps, according to the prior art the surface of the semiconductor wafers is smoothed by strip polishing. In single-side polishing (SSP), the back of a semiconductor wafer is held on a support plate by putty, vacuum or by adhesion during processing. In double-side polishing (DSP), semiconductor wafers are introduced loosely into a thin toothed wheel and are polished simultaneously on the front and back, while they "float freely" between an upper and a lower polishing disc covered by a polishing cloth.

Furthermore, the fronts of the semiconductor wafers are often polished in a haze-free manner, for example with a soft polishing cloth using an alkaline polishing solution. In the literature, this step is often called CMP polishing ("chemo-mechanical polishing"). CMP methods are disclosed in, for example US 2002-0077039 and in US 2008-0305722.

Also known in the prior art are the so-called "fixed abrasive polishing" (FAP) technologies in which the silicon wafer is polished on a polishing cloth which contains an abrasive bound in the polishing cloth ("fixed-abrasive pad"). A polishing step in which an FAP polishing cloth of this type is used will be abbreviated in the following to an FAP step.

WO 99/55491 A1 describes a two-stage polishing method, with a first FAP polishing step and a subsequent second CMP polishing step. In CMP, the polishing cloth does not contain any bound abrasive. Here, as in a DSP step, abrasive is introduced as a suspension between the silicon wafer and the polishing cloth. A two-stage polishing method of this type is used in particular to remove scratches left behind on the polished surface of the substrate by the FAP step.

German patent application DE 102 007 035 266 A1 describes a method for polishing a substrate consisting of silicon material, the method comprising two FAP-type polishing steps which differ in that, in one polishing step, a polish suspension containing unbound abrasive as solids is introduced between the substrate and the polishing cloth, while in the second polishing step, a polish solution which is free from solids is used instead of the polish suspension.

Semiconductor wafers are often provided with an epitaxial layer, i.e. with a monocrystalline grown-on layer having the same crystal orientation, on which semiconductor components are applied at a later stage. Epitaxially coated or epitaxed semiconductor wafers of this type have particular advantages over semiconductor wafers consisting of homogeneous material, for example the prevention of a charge reversal in bipolar CMOS circuits followed by a short circuit of the component ("latch-up problem"), lower defect densities (for example a reduced number of COPs ("crystal-originated particles") and the absence of a significant oxygen content, as a result of which the risk of a short circuit due to oxygen precipitates in component-relevant regions can be ruled out.

It is crucial how the previously described mechanical and chemo-mechanical or purely chemical procedural steps are ordered in a process sequence for the production of a semiconductor wafer.

It is known that the polishing steps such as SSP, DSP and CMP, the etching treatments and the epitaxy step produce a deterioration in the evenness of the semiconductor wafer, particularly in the peripheral region.

Therefore, attempts have been made in the prior art to keep the removal of material during polishing as low as possible to also keep the deterioration in the evenness to a minimum.

It is proposed in U.S. Pat. No. 5942445 A to separate a semiconductor wafer from the crystal (sawing), to round off the edge of the semiconductor wafer, to then carry out a grinding step which can comprise a double-side grinding and a single-side grinding of the front and back of the semiconductor wafer, to subject the semiconductor wafer to an alkaline wet etching procedure and finally to polish the semiconductor wafer by DSP. The double-side grinding can also be replaced by a lapping step. Plasma etching can also be carried out following the wet etching procedure. Finally, the grinding steps and the wet etching procedure can be replaced by plasma etching.

The semiconductor wafers which are polished by DSP and can be obtained by this method have an unsatisfactory shape in the peripheral region due to the use of wet-chemical treatments and to plasma-assisted chemical etching (PACE). Thus, semiconductor wafers with acceptable evenness values are at best available when a peripheral exclusion of at least 2 mm is always taken as a basis, cf. ITRS "Roadmap". In particular, the nano-topology is adversely affected by etching processes. In order to improve the nano-topology after the etching step, in DSP an increased removal of material is necessary which in turn, however, adversely affects the shape in the peripheral region.

Other approaches are required in order to be able to provide semiconductor wafers for future technology generations, which wafers satisfy the high demands made on the edge region of the semiconductor wafer, thus for example to also make available the outermost peripheral region of the wafer to modern lithographic methods (immersion lithography).

SUMMARY

In an embodiment, the present invention provides a method for producing a semiconductor wafer including a number of steps in a particular order including (a) bilateral material-removing processing of the semiconductor wafer, the semiconductor wafer being separated from a single crystal; (b) rounding off an edge of the semiconductor wafer; (c) grinding front and back sides of the semiconductor wafer, the grinding of each side including holding one of the sides with a wafer holder and working the other of the sides with a grinding tool; (d) polishing at least one of the front and back sides of the semiconductor wafer with a polishing cloth including firmly bound abrasives; (e) treating both the front and back sides of the semiconductor wafer with an etching medium so as to carry out a material removal of no more than 1 µm on each of the front and back sides; (f) polishing the front side of the semiconductor wafer using a polishing cloth including firmly bound abrasives and simultaneously polishing the back side of the semiconductor wafer using a polishing cloth that is free of abrasives while providing a polish including abrasives between the back side of the semiconductor wafer and the polishing cloth that is free of abrasives; (g) polishing the edge of the semiconductor wafer; and (h) polishing the back side of the semiconductor wafer using a polishing cloth including firmly bound abrasives and simultaneously polishing the front side of the semiconductor wafer using a polishing cloth that is free of abrasives while providing a polish including abrasives between the front side of the semiconductor wafer and the polishing cloth that is free of abrasives.

DETAILED DESCRIPTION

In an embodiment, the present invention provides a novel process sequence for the production of semiconductor wafers which particularly have a diameter of 450 mm.

In an embodiment, this can be achieved by a method for the production of a semiconductor wafer, the method comprising these steps in the following sequence:

(a) bilateral material-removing processing step of the semiconductor wafer, separated from a single crystal;

(b) rounding off the edge of the semiconductor wafer;

(c) grinding the front and back of the semiconductor wafer, in each case one side of the semiconductor wafer being held by a wafer holder, while the other side is worked by a grinding tool;

(d) polishing at least one side of the semiconductor wafer with a polishing cloth which contains firmly bound abrasives;

(e) treating both sides of the semiconductor wafer with an etching medium with a material removal of not more than 1 µm per side of the semiconductor wafer;

(f) polishing the front of the semiconductor wafer using a polishing cloth having firmly bound abrasives and simultaneously polishing the back of the semiconductor wafer using a polishing cloth which does not contain any abrasives, in which step, however, a polish containing abrasives is introduced between the polishing cloth and the back of the semiconductor wafer;

(g) polishing the edge of the semiconductor wafer;

(h) polishing the back of the semiconductor wafer using a polishing cloth containing firmly bound abrasives and simultaneously polishing the front of the semiconductor wafer using a polishing cloth which does not contain any firmly bound abrasives, a polish containing abrasives being introduced between the polishing cloth and the front of the semiconductor wafer.

First of all, a semiconductor wafer is separated from a single crystal which has been grown using CZ or FZ and consists of semiconductor material. The semiconductor wafer is preferably separated by a wire saw. The semiconductor wafer is separated by a wire saw in the manner known, for example from U.S. Pat. No. 4655191, EP 522 542 A1, DE 39 42 671 A1 or EP 433 956 A1.

The grown single crystal of semiconductor material is preferably a single crystal of silicon. The semiconductor wafer is preferably a monocrystalline silicon wafer.

In the following, the basic steps of the method according to the invention and the preferred configurations thereof will be described in detail.

Step (a)—Bilateral Material-removing Processing Step of the Semiconductor Wafer, Separated from a Single Crystal In step (a) of the method according to the invention, both sides of the semiconductor wafer are processed such that material is removed therefrom.

This can be carried out by means of simultaneous double-disc grinding (DDG) or by PPG (planetary pad grinding). A lapping step is less preferred in the method according to the invention.

Prior art DDG machines, as described, for example in JP2000-280155A and JP2002-307303A, have two opposing grinding wheels, the axes of rotation of which are arranged collinearly. During the grinding procedure, a wafer-shaped workpiece, positioned between the grinding wheels, is simultaneously worked on both sides by the two grinding wheels which rotate about their axes, while the workpiece is held in position by an annular retaining and rotating means and is simultaneously rotated about its own axis. During the grinding procedure, the two grinding wheels are advanced in the axial direction until the desired final thickness of the workpiece is achieved.

The retaining and rotating means can comprise, for example friction wheels which engage on the edge of the workpiece. However, it can also be a means which annularly surrounds the workpiece and engages into a channel, groove or notch which is possibly on the periphery of the workpiece. A means of this type is usually termed a "notch finger". To work the entire surface of the workpiece, said workpiece is guided relative to the grinding wheels such that the abrasive grinding segments of the grinding wheels describe a circular path which runs consistently over the centre of the workpiece.

The workpiece is not usually firmly fixed, but is held axially in position by two devices for a hydrostatic mounting, termed "hydropads" which are attached to both sides of the workpiece. Devices of this type are described in JP2000-280155A. According to the prior art, the surfaces, facing the workpiece, of the two hydropads are planar and are aligned parallel to one another. Each hydropad comprises a plurality of hydrostatic bearings, between which grooves are arranged for removing the medium used for the hydrostatic mounting (hereafter called "hydro-bearing medium") and the grinding coolant.

Integrated into the hydropads are respectively one or more measuring sensors which allow a measurement of the distance between the surface of the hydropads and the surface of the workpiece during the grinding procedure. This distance measurement is usually carried out as a pneumatic dynamic pressure measurement using dynamic pressure nozzles. The dynamic pressure nozzles are configured as simple holes in the edges of the hydrostatic bearings which form the guide surfaces. In order to be able to measure the distance between the hydropads and the workpiece as closely as possible to the location of the grinding work, the dynamic pressure nozzles are generally attached closely to the edge of the hydropads which is adjacent to the grinding wheels.

PPG is a method for the simultaneous bilateral grinding of a plurality of semiconductor wafers, where each semiconductor wafer is positioned, being freely movable, in a recess in one of several runner wheels set into rotation by a roll-off device and is thus moved on a cycloidal curved path, the semiconductor wafers being processed between two rotating working wheels such that material is removed from the wafers and each working wheel comprising a working layer which contains bound abrasive.

The use of a PPG method in step (a) of the method according to the invention is most particularly preferred.

The semiconductor wafer to be processed by PPG preferably already has a rounded edge, but after the PPG step, it is again subjected to an edge rounding procedure of this type. It has been found that a two-part edge rounding step of this type affords advantages, especially as in the case of semiconductor wafers with rounded edges, the PPG method obviously produces semiconductor wafers with an improved shape and nano-topography.

A hard material with a Mohs hardness $\geq 6$ is preferred as the abrasive bound into the working layers. The following are preferably included as abrasive substances: diamond, silicon carbide (SiC), cerium(IV) oxide ($CeO_2$), corundum (aluminium oxide, $Al_2O_3$), zirconium dioxide ($ZrO_2$), boron nitride (BN; cubic boron nitride, CBN), also silicon dioxide ($SiO_2$), boron carbide ($B_4C$) right up to substantially softer substances such as barium carbonate ($BaCO_3$), calcium carbonate ($CaCO_3$) or magnesium carbonate ($MgCO_3$). However, diamond, silicon carbide (SiC) and aluminium oxide, $Al_2O_3$; corundum) are particularly preferred.

The average grain size of the abrasive should be below 9 µm. The preferred size of the abrasive grains bound in the working layers when diamond is the abrasive is on average 0.1 to 9 µm and more preferably 0.1 to 6 µm. The diamonds are preferably bound individually or as clusters in the binding matrix of the working layer. When there is a cluster formation, the grain diameters, stated as being preferred, relate to the primary particle size of the cluster constituents.

Working layers with a ceramic bond are preferably used, a synthetic resin bond being particularly preferred; in the case of working layers with clusters, also a hybrid-bonded system (ceramic bond within the clusters and synthetic resin bond between clusters and working layer matrix).

The hardness of the working layer is preferably at least 80 Shore A. More preferably, the working layer is of a multi-layer construction, with the top layer and the bottom layer having different hardnesses so that point elasticity and long-wave flexibility of the working layer can be adapted independently of one another to the procedural requirements.

Before the first use of a working layer, the abrasive substances bound in the working layer are preferably exposed as a result of removing the uppermost layer in order to utilise the abrasive substances for the grinding procedure. This initial sharpening is carried out using, for example grindstones or blades which are preferably mounted on specifically modified runner wheels and are guided over the two working wheels by the roll-off device. The initial sharpening procedure is also called "dressing" in English.

Dressing is preferably carried out using grindstones containing an abrasive grain which has a similar grain size to the abrasive in the working layers. These "dressing stones" can be annular, for example and can be inserted into an externally toothed driving collar so that they can be guided along between the upper and lower working layers in a suitable manner by the roll-off devices of the grinding machine. When the dressing stones are dressed, they preferably cover the entire surface of the working layers and more preferably they even run slightly beyond the edge thereof, temporarily or constantly. The abrasive grain is preferably bound in the dressing stone such that the wear of the dressing stones still allows an economical dressing operation, but during the dressing process, at least one layer of loose dressing stone grain is always in the working zone between dressing stone surface and working layer surface, so that the dressing procedure is mainly performed by free (unbound) grain.

It has been found that the dressing process produces a disturbed, near-surface layer in the working layer, the depth of which has approximately the extent of the abrasive grain. Thus, a dressing stone with grain which is too coarse imprints a structure onto the working layer which is characterised by the grain of the dressing stone and not by the characteristics of the working layer. This is disadvantageous for the desired self-dressing, which is uniform as far as possible, of the working layer in the subsequent grinding operation. A dressing stone which is too fine removes too little material and results in an uneconomical dressing procedure. Finally, it has been found that dressing mainly by free abrasive grain exerts fewer directed forces onto the working layer due to the roll-off movement of the abrasive grain during the dressing movement than dressing with mainly fixed abrasive grain and a coarser but particularly isotropic, dressed working layer is produced.

A grain is preferably used for sharpening or dressing the working layer which is softer than the abrasive grain used in the working layer. Abrasive grain consisting of corundum (Al2O3) is particularly preferred.

Abrasive substance residues which have become dull as a result of continual wear of the working layer are preferably removed and new, effectively cutting abrasive substances are constantly exposed. Consequently, a continuous operation is possible up until the working layers are completely worn out. This operational condition without an interim re-dressing intervention is called a "self-dressing operation" of the work-ing layers and is particularly preferred. The engagement of the grains, exposed on the surface of the working layers, into the surface of the semiconductor wafers and the material removal effected by the relative movement between working layer and semiconductor wafers is technically termed "multi-grain grinding with a geometrically undetermined cutting edge".

It is further preferred that the material is removed by a mainly extensive engagement by the working layer. The expression "extensive engagement" is understood as meaning that the part of the surface of the working layer which on average is actually in contact with the semiconductor layer during the grinding work is significantly larger than the contact surface of the grinding coating of a cup wheel during processing by a conventional cup wheel grinding process, for example DDG or SSG.

The runner wheels are preferably produced from a completely metal-free material, for example a ceramic material. However, runner wheels are also preferred which have a core of, for example steel or stainless steel and are covered by a non-metallic coating. A coating of this type preferably consists of thermoplasts or duroplasts, ceramics or organic-inorganic hybrid polymers, diamond ("diamond-like carbon", DLC), or alternatively of a hard plating or a nickel-phosphorus coating.

When the runner wheels are made of metal or they have a metal core, the walls of the recesses for receiving the semiconductor wafers are preferably lined with a ceramic material. Consequently, there is no direct contact between the semiconductor wafer and the metal of the runner wheel.

The recesses for receiving the semiconductor wafers in the runner wheels are preferably made eccentrically with respect to the centre of the respective runner wheel such that the centre point of the runner wheel is outside the surface of the semiconductor wafers. One runner wheel preferably has three to eight recesses for semiconductor wafers. During a grinding procedure, there are preferably five to nine runner wheels at the same time in the grinding machine.

The pressure by which the working layers are pressed against the semiconductor wafers during processing, and the path speed of the semiconductor wafers over the working layers are preferably selected during the main load step such that the total removal rate, i.e. the sum of the removal rates on both sides of the semiconductor wafers is from 2 to 60 µm/min. The term "main load step" is understood as meaning the processing phase within which the greatest proportion of total removal of the entire grinding treatment is produced, where in turn "processing phase" is understood as a period of time during which all the procedural parameters remain constant. The main load step is generally the processing phase with the highest pressure or with the proportionately longest duration, or both. In the case of a working layer with diamond grinding grains of an average size of 3 to 15 µm, a removal rate of between 2.5 and 25 µm/min is particularly preferred.

For the pressure exerted by the working wheels on the semiconductor wafers during the main load step, a range of from 0.007 to 0.5 bars is preferred and a range of from 0.012 to 0.3 bars is particularly preferred. For these values, the pressure is based on the total surface of the semiconductor wafers located in the device for processing and not on the effective contact surface between working layer and semiconductor wafers.

Furthermore, an opposite rotation of the working wheels relative to the average rotational speed of the runner wheels during the main load step of the processing is preferred. In addition, it is particularly preferred that the pressures, rotational speeds and thus path speeds assume different values for the different processing phases. Finally, it is also particularly preferred that in specific low pressure processing phases ("spark out" phases), the working wheels rotate in the same direction. A spark out phase of this type is expedient particularly right at the end of the entire grinding treatment and is therefore preferred.

During the processing, the temperature prevailing in the working gap formed between the working layers is preferably kept constant. For this purpose, the runner wheels can have openings through which cooling lubricant can be exchanged between the lower and upper working wheels, so that the upper and lower working layers are always at the same temperature. This counteracts an undesirable deformation of the working gap formed between the working layers by deformation of the working layers or working wheels due to thermal expansion with a changing load. Furthermore, the cooling of the abrasives bound into the working layers is improved and becomes more uniform and, as a result, the effective service life thereof is prolonged.

The cooling lubricant which is used preferably consists of a water-based mixture with viscosity-modifying additives, such as glycols, short- or longer-chain polyethylene glycols, alcohols, sols or gels and similar substances which are known as coolants or lubricants.

However, a particularly preferred cooling lubricant is also pure water without any additives.

The quantities of cooling lubricant supplied to the working gap via the leadthrough in the upper working wheel are preferably within a range of between 0.2 and 50 l/min and more preferably between 0.5 and 20 l/min.

The preferred starting thickness before the processing with step a) of the method according to the invention is from 500 to 1000 µm. A starting thickness of from 775 to 950 µm is particularly preferred for silicon wafers with a diameter of 300 mm.

The final thickness of the semiconductor wafers after processing according to step a) of the method according to the invention is preferably from 500 to 950 µm and more preferably from 775 to 870 µm.

The total removal, i.e. the sum of the individual removals from both sides of the semiconductor wafer is preferably from 7.5 to 120 µm and more preferably from 15 to 90 µm.

The shape of the working gap formed between the working layers is preferably determined during the grinding procedure and the shape of the working surface of at least one working wheel is changed mechanically or thermally subject to the measured shape of the working gap such that the working gap has a predetermined shape.

During processing, the semiconductor wafers preferably temporarily leave the working gap, defined by the working layers, with a part of their surface, the maximum of the overrun in a radial direction amounting to more than 0% and at most 20% of the diameter of the semiconductor wafer, the overrun being defined as the length measured in a radial direction based on the working wheels, by which length the one semiconductor wafer projects beyond the inner edge or outer edge of the working gap at a specific time during the grinding procedure.

Step (b)—Rounding Off the Edge of the Semiconductor Wafer:

In step (b), the semiconductor wafer is provided with a rounded edge.

For this purpose, the semiconductor wafer is fixed on a rotating table and is advanced with its edge against the also rotating working surface of a machining tool. The machining tools used in this respect can be configured as discs which are attached to a spindle and have peripheral surfaces which are used as working surfaces for processing the edge of the semiconductor wafer. The material-removing grain can be firmly anchored in the working surfaces of the machining tools. For the most part, the grain used has a coarse grain size. The average grain size is preferably greater than or equal to 10 µm.

These grinding machining tools are suited to providing the semiconductor wafer with rounded edges. However, after the edge rounding step, a particular minimum roughness usually remains on the edge surface.

In a later processing step, the ground edge, also treated with an etching medium, of the wafer is thus polished in step (g).

If PPG is used in step (a) of the method, it is preferred to carry out two edge grinding steps, in which case the first edge rounding step takes place before the PPG step.

Step (c)—Grinding the Front and Back of the Semiconductor Wafer

In step (c) of the method, both sides of the semiconductor wafer are ground.

The front and back are preferably ground sequentially.

For this purpose, the semiconductor wafer, held on a wafer holder, and an opposite grinding wheel are rotated independently of one another, the grinding wheel being in a laterally offset arrangement relative to the semiconductor wafer and being positioned such that an axial centre of the semiconductor wafer passes into a working region of the grinding wheel, the grinding wheel being moved at an advance speed in the direction of the semiconductor wafer, as a result of which the grinding wheel and semiconductor wafer are advanced towards one another while the semiconductor wafer and grinding wheel rotate about parallel axes so that a surface of the semiconductor wafer is ground and, after a specific material removal has been achieved, the grinding wheel is guided back at a return speed.

It is preferred for the grinding wheel and the semiconductor wafer to be advanced by a path of 0.03 to 0.5 µm during a rotation of the semiconductor wafer. The choice of advance during a rotation of the semiconductor wafer of 0.03 to 0.1 µm is most particularly preferred.

A grinding wheel which has a grain size of greater than or equal to # 2000 is preferably used, a grain size of # 2000 to # 8000 being most particularly preferred.

The grain size is usually given in # ("mesh") according to Japanese Industrial Standard JIS R 6001:1998.

An average particle size can be calculated from the mesh numbers:

The use of grinding wheels with a fine granulation is often referred to as fine grinding. Fine grinding wheels of this type have a granulation of, for example, # 1000 to # 4000 and are commercially available from Disco Corporation.

In the conversion into particle sizes, it is found that, for example # 1200 corresponds to an average particle size of 9.5 µm, # 5000 corresponds to an average particle size of 2.5 µm and # 8000 corresponds to an average particle size of 1.2 µm.

Thus, the average particle sizes in fine grinding are slightly greater than or equal to 1 µm or are less than or equal to 10 µm.

A sequence of two series-connected grinding steps is particularly preferred, where the first step is carried out using grinding wheels of a granulation of less than or equal to # 2000 in order to achieve the highest possible removal rates and short processing times (coarse grinding) and the second subsequent step is carried out using grinding wheels of a granulation of greater than # 2000 and less than or equal to # 8000 to obtain particularly smoothly ground wafers with a minimal damage of approximately 1 µm (fine grinding).

The total removal by the fine grinding step is preferably 25 µm, with a symmetrical removal of approximately 12.5 µm per side.

The rotational speed of the grinding wheel is preferably 1000 to 5000 min-1.

The rotational speed of the semiconductor wafer is preferably 50 to 300 min-1, most particularly preferably 200 to 300 min-1.

The advance speed is preferably 10 to 20 μm/min.

Step (d)—FAP Polishing of at Least One Side of the Semiconductor Wafer

In step (d), at least one side of the semiconductor wafer is polished with a polishing cloth containing abrasives.

In step (d), only the front of the semiconductor wafer is preferably polished.

In step (d), only the back of the semiconductor wafer is preferably polished.

In step (d), the front and the back of the semiconductor wafer are preferably polished.

During the polishing step, a polish solution which is free from solids is preferably introduced between the side, to be polished, of the semiconductor wafer and the polishing cloth.

In the simplest case, the polish solution is water, preferably deionised water (DIW) with the purity conventionally used in the semiconductor industry.

However, the polish solution can also contain compounds such as sodium carbonate (Na2CO3), potassium carbonate (K2CO3), sodium hydroxide (NaOH), potassium hydroxide (KOH), ammonium hydroxide (NH4OH), tetramethylammonium hydroxide (TMAH) or any mixtures thereof. The use of potassium carbonate is most particularly preferred. In this case, the pH value of the polish solution is preferably within a range of from 10 to 12 and the content of the mentioned compounds in the polish solution is preferably from 0.01 to 10% by weight, more preferably from 0.01 to 0.2% by weight.

Furthermore, the polish solution can contain one or more further additives, for example surface-active additives such as wetting agents and surfactants, stabilisers acting as protective colloids, preservatives, biocides, alcohols and complex formers.

A polishing cloth is used which contains an abrasive substance bound in the polishing cloth (FAP or FA cloth or FA pad).

Suitable abrasive substances include, for example, particles of oxides of the elements cerium, aluminium, silicon, zirconium and particles of hard substances, such as silicon carbide, boron nitride and diamond.

Polishing cloths which are particularly suitable have a surface topography which is characterised by replicated microstructures. These microstructures ("posts") have, for example, the shape of columns with a cylindrical or polygonal cross section or the shape of pyramids or truncated pyramids.

More detailed descriptions of this type of polishing cloth are provided, for example, in WO 92/13680 A1 and US 2005/227590 A1.

The use of a polishing cloth which has firmly bound abrasives of cerium oxide is most particularly preferred, as described for example in U.S. Pat. No. 6,602,117 B1.

The grain sizes of the FAP polishing cloths which are used (size of the firmly bound abrasives/particles) are preferably greater than or equal to 0.1 μm and are less than or equal to 1.0 μm.

A particle size of from 0.1 to 0.6 μm is particularly preferred.

A particle size of from 0.1 to 0.25 μm is most particularly preferred.

For the FA polishing, the procedure is preferably carried out with removed amounts of greater than or equal to 1 μm per side and, in this respect, the range of 1 to 3 μm is particularly preferred and a range of 1.5 to 2 μm is most particularly preferred.

The wafers processed by the FA polishing have preferably been previously worked on both sides by grinding wheels having a granulation of # 2000 to # 8000 (fine grinding).

Step (e)—Etching or Cleaning the Semiconductor Wafer

In step (e) of the method according to the invention, both sides of the semiconductor wafer are treated with an etching medium with a material removal of not more than 1 μm per side of the semiconductor wafer.

The minimum material removal per side of the semiconductor wafer is preferably one monolayer, i.e. approximately 0.1 nm.

The semiconductor wafer preferably undergoes a wet-chemical treatment using an acidic medium.

Suitable acidic media are aqueous solutions of hydrofluoric acid, nitric acid or acetic acid.

It is most particularly preferred to treat the semiconductor wafer with a gaseous medium containing hydrogen fluoride and at least one oxidant which oxidises the surface of the semiconductor wafer. In this case, it is particularly advantageous for the gaseous medium to flow onto the surfaces of the semiconductor wafer at a relative speed within a range of from 40 mm/s to 300 m/s.

Thus, the gaseous medium contains hydrogen fluoride and at least one oxidant. The oxidant should be capable of oxidising the semiconductor material, for example silicon.

The oxidation of a silicon surface produces, for example a silicon oxide, preferably silicon dioxide. In turn, this is chemically attacked by hydrogen fluoride, thereby producing as reaction products hexafluorosilicic acid (H2SiF6), silicon tetrafluoride (SiF4) and water which are removed by the flow of the gaseous medium. The gaseous medium can also contain further constituents, for example inert carrier gases such as nitrogen or argon, to influence the flow conditions and removal rates.

At least one oxidant is preferably used which is selected from the group consisting of nitrogen dioxide, ozone and chlorine. The use of pure chlorine necessitates the addition of water vapour to oxidise the silicon surface. In the use of a mixture of nitrogen dioxide and chlorine as well as ozone and chlorine, the addition of chlorine serves the purpose of using the water, released in the reaction of hydrogen fluoride with silicon dioxide, for the further oxidation of the silicon surface, and thus of preventing a condensation of the water, released in the reaction, even at low flow velocities and temperatures. It is particularly preferred to use ozone due to its high oxidation potential, the unproblematic reaction products and the simple preparation by ozone generators widely used in the semiconductor industry.

To prepare the gaseous medium, the constituents can be mixed in the desired quantity ratios. The ratio of hydrogen fluoride to oxidant is typically selected within a range of from 1:1 to 4:1. The gaseous medium can either be supplied by the direct feed of the individual components into the processing chamber or can be delivered into a mixer connected upstream, or by passing the gaseous oxidant through a liquid aqueous solution of hydrogen fluoride of a suitable concentration. This can take place, for example in a so-called wash bottle or in a comparable device. When the gaseous oxidant passes through the aqueous solution, said oxidant is enriched with water and hydrogen fluoride, thereby producing the required gaseous medium.

With the same procedural parameters and with a constant ratio of hydrogen fluoride to oxidant, an increase in temperature and an increase in the concentration exhibit a reaction-accelerating effect.

The etching procedure in the gas phase serves to reduce the roughness of the semiconductor wafer, which means that the polishing removal can be reduced, and also serves to remove impurities and to reduce superficial defects in the crystal structure.

The cleaning and etching processes which have been described are preferably carried out as a single wafer treatment.

SSEC 3400 ML manufactured by Solid State Equipment Corp./USA which is configured for substrates up to a size of 500 mm×500 mm is specifically suited to a semiconductor wafer which is particularly preferred in the context of the method according to the invention and has a diameter of 450 mm.

Step (g)—Polishing the Edge of the Semiconductor Wafer

In step (g), the edge of the semiconductor wafer is polished.

Commercially available automatic edge-polishing machines are suitable for carrying out step (g) of the method according to the invention.

U.S. Pat. No. 5,989,105 discloses a device of this type for edge polishing, in which the polishing drum consists of an aluminium alloy and is covered by a polishing cloth.

The semiconductor wafer is usually fixed on a planar wafer holder, a so-called chuck. The edge of the semiconductor wafer projects over the chuck so that it is freely accessible to the polishing drum. A centrally rotating polishing drum which is inclined at a specific angle towards the chuck and is covered by a polishing cloth and the chuck with the semiconductor wafer are advanced towards one another and are pressed against one another under a specific contact pressure while the polish is supplied continuously.

For the edge polishing procedure, the chuck is rotated centrally with the semiconductor wafer held thereon.

One rotation of the chuck preferably lasts from 20 to 300 s, more preferably from 50 to 150 s (rotation time).

A polishing drum which is covered by the polishing cloth and which is preferably rotated centrally at a speed of from 300 to 1500 min-1, more preferably from 500 to 1000 min-1 and the chuck are advanced towards one another, the polishing drum being positioned obliquely against the semiconductor wafer at a set angle and the semiconductor wafer being fixed on the chuck such that it projects slightly over the chuck and is thus accessible to the polishing drum.

The set angle is preferably from 30 to 50°.

The semiconductor wafer and the polishing drum are pressed against one another with a specific contact pressure while a polish is supplied continuously, preferably with a polish flow of 0.1 to 1 litre/min, more preferably 0.15 to 0.40 litre/min, it being possible for the contact pressure to be set by weights attached to rollers and said contact pressure preferably being 1 to 5 kg, more preferably 2 to 4 kg.

After 2 to 20, more preferably after 2 to 8 rotations of the semiconductor wafer or of the chuck holding the semiconductor wafer, the polishing drum and semiconductor wafer are preferably moved away from one another.

In these conventional edge polishing methods, the local shape in the peripheral region of the semiconductor wafer is for the most part adversely affected. This is linked to the fact that with the relatively "soft edge polishing cloths" used in this respect (relatively soft polishing cloths charged with silica sol are usually used), not only the edge itself, but also an outer part of the front and/or back of the semiconductor wafer is polished, which can be explained by "immersion" of the hard edge into the polishing cloth charged with polish suspension. Consequently, not only is material removed in the region of the actual edge, but also in the adjoining region on the front and/or back.

For this reason, the edge polishing procedure of the semiconductor wafer is preferably carried out in the method according to the invention by fixing the semiconductor wafer on a centrally rotating chuck, advancing the semiconductor wafer and a centrally rotating polishing drum which is inclined towards the chuck and covered by a polishing cloth containing firmly bound abrasives (FAP polishing cloth) and pressing the semiconductor wafer and the polishing drum against one another with the continuous supply of a polish solution which does not contain any solids.

By this edge polishing method, it is possible to influence the edge of the wafer in a targeted manner, without impairing the adjoining region of front and/or back of the semiconductor wafer and thus, for example to set the desired geometrical and surface characteristics only on the edge of the wafer.

The FAP cloth which is used is substantially harder and far less compressible than the polishing cloths used as standard and it also affords the advantage of producing the removal without alkaline-charged silica sol, for example only by using an alkaline solution, which also prevents the spread of polish onto the front of the wafer and thus prevents the additional adverse affect on the surface of the wafer, in the form of, for example increased defect rates such as LLS (localised light scatterers) due to etchings.

In addition to this, a short soft polishing step using gently removing silica sol can be subsequently carried out on the same FAP polishing cloth to reduce the edge roughness and the defect rates.

The two polishing steps can then be coordinated with one another, so that the wafer edge shape and surface can be influenced in a positive and targeted manner, without an adverse effect on the partial sites on the front and back of the wafer.

Thus, in principle the semiconductor wafer is preferably polished by means of a polishing drum, on the surface of which a hard and difficultly compressible polishing cloth is affixed which contains firmly bound adhesives, with the supply of an alkaline solution.

Thereafter, in a second step, a smoothing step is preferably carried out on the same polishing cloth, with the supply of a silica sol, for example Glanzox 3900* with approximately 1% by weight of $SiO_2$.

* Glanzox 3900 is the product name of a polish suspension supplied as a concentrate by Fujimi Incorporated, Japan. The base solution of this concentrate has a pH of 10.5 and contains approximately 9% by weight of colloidal $SiO_2$ with an average particle size of 30 to 40 nm.

It has been found that an edge polishing step of this type using an FAP cloth completely avoids the impairment, observed in the prior art, in the local shape in the peripheral region of the semiconductor wafer.

A further advantage is that the spread of polish in the removing step of the edge polishing procedure and thus the appearance of surface defects due to uncontrolled etchings on the wafer surface are prevented.

The polish solution used in the edge polishing procedure is, in the simplest case, water, preferably deionised water (DIW) with the purity conventionally used in the semiconductor industry.

However, the polish solution can also contain compounds such as sodium carbonate ($NaCO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any mixtures thereof.

The use of potassium carbonate is most particularly preferred.

The pH value of the polish solution is preferably within a range of from 10 to 12 and the content of the mentioned compounds in the polish solution is preferably from 0.01 to 10% by weight, more preferably from 0.01 to 0.2% by weight.

Furthermore, the polish solution can contain one or more further additives, for example surface-active additives such as wetting agents and surfactants, stabilisers acting as protective colloids, preservatives, biocides, alcohols and complex formers.

In the preferred second step of the edge polishing procedure, a polish containing abrasives is used.

The content of abrasive substance in the polish suspension is preferably 0.25 to 20% by weight, more preferably 0.25 to 1% by weight.

The size distribution of the abrasive particles preferably has a monomodal occurrence.

The average particle size is from 5 to 300 nm, more preferably from 5 to 50 nm.

The abrasive substance consists of a material which mechanically removes the substrate material, and preferably consists of one or more of the oxides of the elements aluminium, cerium or silicon.

A polish suspension is particularly preferred which contains colloid-disperse silicic acid.

In the optional second step of the edge polishing procedure, in contrast to the first step, preferably no additives such as sodium carbonate (Na2CO3), potassium carbonate (K2CO3), sodium hydroxide (NaOH), potassium hydroxide (KOH), ammonium hydroxide (NH4OH), tetramethylammonium hydroxide (TMAH) are added.

However, the polish suspension can contain one or more further additives, for example surface-active additives such as wetting agents and surfactants, stabilisers acting as protective colloids, preservatives, biocides, alcohols and complex formers.

Thus in step (g) of the method according to the invention, a polishing cloth is preferably used which contains an abrasive substance bound in the polishing cloth (FAP cloth or FA pad).

Suitable abrasive substances include, for example, particles of oxides of the elements cerium, aluminium, silicon, zirconium and particles of hard substances, such as silicon carbide, boron nitride and diamond.

Particularly preferred polishing cloths have a surface topography which is characterised by replicated microstructures. These microstructures ("posts") have, for example, the shape of columns with a cylindrical or polygonal cross section or the shape of pyramids or truncated pyramids.

More detailed descriptions of this type of polishing cloth are provided, for example, in WO 92/13680 A1 and US 2005/227590 A1.

The use of cerium oxide particles bound in the polishing cloth is particularly preferred, cf. also U.S. Pat. No. 6,602,117 B1.

The average particle size of the FAP polishing cloth is preferably 0.1 to 1.0 µm, more preferably 0.1 to 0.25 µm.

Particularly suitable for implementing the method is a polishing cloth which has a multilayered structure, comprising a layer containing abrasives, a layer consisting of a rigid plastics material and a flexible, non-woven layer, the layers being joined together by pressure-sensitive adhesive layers.

The layer consisting of a rigid plastics material preferably contains polycarbonate.

The polishing cloth can contain an additional layer of polyurethane foam.

One of the layers of the polishing cloth is flexible in this case.

The flexible layer is preferably a non-woven layer.

The flexible layer preferably contains polyester fibres. A layer of polyester fibres which are impregnated with polyurethane ("non-woven") is particularly suitable.

The flexible layer allows adaptability of the cloth height and a conformity thereof to constant transitions.

The flexible layer preferably corresponds to the lowest layer of the polishing cloth. Positioned over the flexible layer is preferably a foam layer, for example of polyurethane which is attached to the flexible layer by an adhesive layer. Positioned over the PU foam is a layer of a relatively hard, rigid material, preferably of a rigid plastics material, for which polycarbonate is suitable, for example. Positioned over this rigid layer is the layer with the micro-replicates, i.e. the actual fixed abrasive layer.

However, the flexible layer can also be positioned between the foam layer and the rigid layer or directly under the fixed abrasive layer.

The different layers are preferably attached to one another by pressure-sensitive adhesive layers (PSA).

The inventor has found that a polishing cloth without the PU foam layer which is always present in prior art FAP polishing cloths produces good results.

In this case, the polishing cloth comprises a layer with the micro-replicates, a flexible layer and a layer consisting of a rigid plastics material such as polycarbonate, where the flexible layer can either be the middle or the bottom layer of the polishing cloth.

The grain sizes of the FAP polishing cloths used are preferably greater than or equal to 0.1 µm and less than or equal to 1.0 µm, more preferably 0.1 to 0.25 µm.

Steps (f) and (h)—Bilateral Polishing by FAP and CMP

Furthermore, in step (f), the front of the semiconductor wafer is polished using a polishing cloth with firmly bound abrasives and the back of the semiconductor wafer is polished at the same time using a polishing cloth which does not contain any abrasives, but a polishing cloth containing abrasives is introduced between the polishing cloth and the back of the semiconductor wafer.

In step (g), an edge polishing procedure is carried out, as previously described.

Thereafter, in step (h), the back of the semiconductor wafer is polished using a polishing cloth with firmly bound abrasives and the front of the semiconductor wafer is polished at the same time using a polishing cloth which does not contain any firmly bound abrasives, a polishing cloth containing abrasives being introduced between the polishing cloth and the front of the semiconductor wafer.

Therefore, the invention provides in steps (f) and (h) a combined simultaneous double-side polishing process in that an FAP polishing and a CMP polishing are simultaneously carried out once on the front/back and then on the back/front. The conventional DSP step and the subsequent separate CMP step are not required.

Steps (f) and (h) can be carried out on existing installations for the double-side polishing of semiconductor wafers, for example on a commercially available double-side polishing machine of type AC2000 manufactured by Peter Wolters, Rendsburg (Germany).

This polishing machine is fitted with a pin toothing of the outer and inner rings to drive the runner wheels. The installation can be configured for one or more runner wheels. On account of the high throughput, an installation is preferred for a plurality of runner wheels, as described for example in DE-100 07 390 A1 and in which the runner wheels move on a planetary path around the centre of the installation. A lower and an upper polishing disc are part of the installation and are freely horizontally rotatable and are covered by a polishing cloth.

During the polishing process, the semiconductor wafers are located in the recesses in the runner wheels and between the two polishing discs which rotate and exert a specific polishing pressure on the wafers, while a polish is supplied continuously. In this respect, the runner wheels are also set into rotation, preferably by rotating pin rings which engage into teeth on the periphery of the runner wheels.

A typical runner wheel comprises recesses for receiving three semiconductor wafers. Located on the periphery of the recesses are inserts which are to protect the edges of the semiconductor wafers which are susceptible to breaking, in particular to also protect against a release of metals from the body of the runner wheels. The runner wheel body can consist of, for example metal, ceramics, plastics material, fibre-reinforced plastics material or metal coated with plastics material or with a diamond-like carbon layer ("diamond-like carbon", DLC layer). However, steels are preferred, more preferably chromium stainless steel. The recesses are preferably configured to receive an uneven number of semiconductor wafers with a diameter of at least 200 mm, preferably 300 mm, most particularly preferably 450 mm and thicknesses of 500 to 1000 μm.

The polish used for polishing with a polishing cloth which does not contain any firmly bound abrasives, contains abrasives. This polish is a polish suspension.

The size distribution of the abrasive particles preferably has a monomodal occurrence.

The average particle size is from 5 to 300 nm, more preferably from 5 to 50 nm.

The abrasive substance consists of a material which mechanically removes the substrate material, and preferably consists of one or more of the oxides of the elements aluminium, cerium or silicon.

The content of abrasive substance in the polish suspension is preferably 0.25 to 20% by weight, more preferably 0.25 to 1% by weight.

The use of colloid-disperse silicic acid as the polish suspension is particularly preferred.

The aqueous polishes Levasil® 200 produced by Bayer AG and Glanzox 3900® produced by Fujimi, are used for example.

The polish preferably contains additives such as sodium carbonate (Na2CO3), potassium carbonate (K2CO3), sodium hydroxide (NaOH), potassium hydroxide (KOH), ammonium hydroxide (NH4OH), tetramethylammonium hydroxide (TMAH).

However, the polish suspension can contain one or more further additives, for example surface-active additives such as wetting agents and surfactants, stabilisers acting as protective colloids, preservatives, biocides, alcohols and complex formers.

In the method according to the invention, according to steps (f) and (h), a polishing cloth is also used which contains an abrasive substance bound in the polishing cloth (FAP or FA cloth or FA pad).

Suitable abrasive substances include, for example, particles of oxides of the elements cerium, aluminium, silicon, zirconium and particles of hard substances, such as silicon carbide, boron nitride and diamond.

Polishing cloths which are particularly suitable have a surface topography which is characterised by replicated microstructures. These microstructures ("posts") have, for example, the shape of columns with a cylindrical or polygonal cross section or the shape of pyramids or truncated pyramids.

More detailed descriptions of this type of polishing cloth are provided, for example, in WO 92/13680 A1 and US 2005/227590 A1.

The use of a polishing cloth with firmly bound-in abrasives of cerium oxide, as described, for example, in U.S. Pat. No. 6,602,117 B1 is most particularly preferred.

The grain sizes of the FAP polishing cloths used (size of the firmly bound abrasives/particles) are preferably greater than or equal to 0.1 μm and less than or equal to 1.0 μm.

A particle size of 0.1 to 0.6 μm is particularly preferred.

A particle size of 0.1 to 0.25 μm is most particularly preferred.

One polishing disc is fitted with an FAP cloth of this type.

The second polishing disc is covered by a conventional CMP polishing cloth.

The CMP polishing cloths used are polishing cloths which have a porous matrix.

The polishing cloth preferably consists of a thermoplastic or heat-hardenable polymer. A large number of materials are considered, for example polyurethanes, polycarbonate, polyamide, polyacrylate, polyester, etc.

The polishing cloth preferably contains solid, micro-porous polyurethane.

The use of polishing cloths consisting of foamed sheets or felt or fibre substrates impregnated with polymers is also preferred.

Coated/impregnated polishing cloths can also be configured such that they have a different pore distribution and different pore sizes in the substrate than in the coating.

The polishing cloths can be substantially planar or they can also be perforated.

To control the porosity of the polishing cloth, fillers can be introduced into the cloth.

Commercially available polishing cloths are for example SPM 3100 by Rodel Inc. or the cloths of the DCP series as well as the cloths of trademarks IC1000™, Polytex™ or SUBA™ by Rohm & Hass.

As previously mentioned, when carrying out a polishing procedure according to steps (f) and (h) of the method according to the invention on a double-side polishing machine, as is the case, for example with type AC 2000 manufactured by Peter Wolfers/Rendsberg, the unilateral haze-free polishing (CMP) which is obligatory in the prior art can be omitted, since the polishing which determines the shape and the polishing which determines the surface quality can be carried out fully on one type of machine.

However, in the prior art, the removal polishing and haze-free polishing (DSP and CMP) were carried out separately from one another and on different polishing machines. Only the front of the semiconductor wafer was polished by CMP in the prior art.

To achieve an optimum wafer shape, here in particular the peripheral shape (edge roll-off elimination), a simultaneous double-side polishing with planetary kinematics and a combined use of fixed abrasive and CMP polishing cloths affords advantages, because the fixed abrasive polishing process makes it possible, due to the hard cloth which can optionally be configured with an overrun, to dispense with a silica sol-containing component to achieve the desired polishing removal and it also makes it possible to influence, in a targeted manner, the peripheral region of the semiconductor wafer.

In addition, the CMP polishing is already integrated in the framework of the simultaneous bilateral polishing, in that one of the polishing discs is fitted with a CMP polishing cloth on which the CMP step is carried out.

The double-side polishing procedure according to the invention takes place in two sub-polishing steps (f) and (h), between which the edge of the semiconductor wafer is polished according to step (g).

A two-stage edge polishing procedure is preferably carried out in which a first edge polishing procedure takes place between the two sub-steps of the double-side polishing procedure (f) and (h) and the second edge polishing procedure takes place at the end of the entire double-side polishing process, i.e. after step (h), which makes it possible to adjust more finely the edge polishing procedure by this division into two steps and thus to affect as little as possible the peripheral shape of the semiconductor wafer.

Both steps of the edge polishing procedure are preferably carried out using polishing cloths with abrasives bound firmly therein.

The second edge polishing procedure is preferably carried out with the supply of a polish suspension which contains abrasives, like the optional soft polishing step described under (g).

The content of abrasive substances in the polish suspension is preferably 0.25 to 20% by weight.

The abrasive substances in the polish suspension are preferably selected from one or more of the group consisting of oxides of the elements aluminium, cerium or silicon.

The polish suspension is preferably colloid-disperse silicic acid.

The pH value of the polish suspension is preferably 9 to 11.5.

The pH value of the polish suspension is preferably adjusted by the addition of additives, selected from the group consisting of sodium carbonate (Na2CO3), potassium carbonate (K2CO3), sodium hydroxide (NaOH), potassium hydroxide (KOH), ammonium hydroxide (NH4OH), tetramethylammonium hydroxide (TMAH) or any mixtures of these compounds.

To achieve a specifically desired defined roughness of the polished back of the wafer, it can be advantageous to carry out additional unilateral FAP polishing procedures on the back:

This preferably takes place in three steps, in each case using a polishing cloth which contains an abrasive substance bound in the polishing cloth and is pressed with a polishing pressure onto the back of the semiconductor wafer and, in the first step, a polish which is free from solids, but in the second and third steps a polish which contains abrasive substances is introduced between the polishing cloth and the back of the semiconductor wafer, a polishing pressure in the first and second steps of 8 to 15 psi being reduced in the third step to 0.5 to 5 psi.

The semiconductor wafer preferably has on the planar surface of its back an average surface roughness Ra within a broad range of from 0.3 to 4.5 nm, based on local wavelengths of less than or equal to 250 µm.

Suitable for determining the surface roughness is for example a Chapman Surface Profiler MP 2000 with a 250 µm filter (spatial wavelengths greater than 250 µm=waviness data, cf. Chapman Technical Note-TG-1, Rev-01-09).

If a high back roughness is desired within the above-mentioned range, FAP cloths with grain sizes of from 0.5 to 1.0 µm are preferably used.

If a low back roughness is desired, FAP cloths with grain sizes of from 0.1 to 0.25 µm are preferably used.

The polish solution in the first step of the polishing procedure of the back of the silicon wafer of the method according to the invention is, in the simplest case, water, preferably deionised water (DIW) with the purity conventionally used in the semiconductor industry.

However, the polish solution can also contain compounds such as sodium carbonate (Na2CO3), potassium carbonate (K2CO3), sodium hydroxide (NaOH), potassium hydroxide (KOH), ammonium hydroxide (NH4OH), tetramethylammonium hydroxide (TMAH) or any mixtures thereof.

The use of potassium carbonate is most particularly preferred.

In the second step of the polishing procedure of the back of the semiconductor wafer, a polish containing abrasives is used.

The abrasive substance consists of a material which mechanically removes the substrate material, and preferably consists of one or more of the oxides of the elements aluminium, cerium or silicon.

A polish suspension is particularly preferred which contains colloid-disperse silicic acid.

In the third step of the polishing procedure of the back of the semiconductor wafer, a polish containing abrasives is also used, as in the second step. The polishing pressure is reduced from 8 to 15 psi to 0.5 to 5 psi, compared to the first and second steps.

Conventional polishing machines, such as the "nHance 6EG" polishing machine manufactured by Strasbaugh Inc. are suitable for performing these polishing procedures.

The polishing machine by Strasbaugh Inc. has a polishing disc with a polishing cloth and a polishing head which processes a semiconductor wafer in a fully automatic manner. The polishing head is mounted cardanically and comprises a fixed base plate coated with a "backing pad", and a movable guide ring. Air cushions can be built up through holes in the base plate, in two concentric pressure zones, an inner pressure zone and an outer pressure zone, the semiconductor wafer floating on said air cushions during the polishing procedure. The movable guide ring can be pressurised by a compressed air bellows to thus pre-tension the polishing cloth during contact with the semiconductor wafer and to keep it flat.

Particularly Preferred Embodiments

In the following, particularly preferred embodiments A-F of the method according to the invention are presented. The abbreviations which are used: PPG, DDG, FAP and CMP have been previously explained.

A

Separation of a wafer from single crystal–edge rounding–PPG–edge rounding–bilateral fine grinding>bilateral FAP–gas phase etching–FAP of the back and simultaneous CMP of the back>edge polishing–FAP back and simultaneous CMP front–edge polishing

B

Separation of a wafer from single crystal–edge rounding–PPG–edge rounding–bilateral fine grinding>FAP of the back–gas phase etching–FAP of the back and simultaneous CMP of the back>edge polishing–FAP back and simultaneous CMP front–edge polishing

C

Separation of a wafer from single crystal–edge rounding–PPG–edge rounding–bilateral fine grinding>FAP of the front–gas phase etching–FAP of the back and simultaneous CMP of the back>edge polishing–FAP back and simultaneous CMP front–edge polishing

D

Separation of a wafer from single crystal–DDG–edge rounding–bilateral fine grinding>bilateral FAP–gas phase etching-FAP of the back and simultaneous CMP of the back>edge polishing-FAP back and simultaneous CMP front-edge polishing

E

Separation of a wafer from single crystal-DDG-edge rounding-bilateral fine grinding>FAP of the back-gas phase etching-FAP of the back and simultaneous CMP of the back>edge polishing-FAP back and simultaneous CMP front-edge polishing

F

Separation of a wafer from single crystal-DDG-edge rounding-bilateral fine grinding>FAP of the front-gas phase etching-FAP of the back and simultaneous CMP of the back>edge polishing-FAP back and simultaneous CMP front-edge polishing The final step of the edge polishing is preferably followed by a final cleaning procedure.

Furthermore, the semiconductor wafer can be subjected to a thermal treatment or can be provided with an epitaxial layer.

While the invention has been particularly shown and described with reference to preferred embodiments thereof, it will be understood by those skilled in the art that various changes in form and details may be made therein without departing from the spirit and scope of the invention.

The invention claimed is:

1. A method for producing a semiconductor wafer comprising steps in the order of:
   (a) bilateral material-removing processing of the semiconductor wafer, the semiconductor wafer being separated from a single crystal;
   (b) rounding off an edge of the semiconductor wafer;
   (c) grinding front and back sides of the semiconductor wafer, the grinding of each side including holding one of the sides with a wafer holder and working the other of the sides with a grinding tool;
   (d) polishing at least one of the front and back sides of the semiconductor wafer with a polishing cloth including firmly bound abrasives;
   (e) treating both the front and back sides of the semiconductor wafer with an etching medium so as to carry out a material removal of no more than 1μm on each of the front and back sides;
   (f) polishing the front side of the semiconductor wafer using a polishing cloth including firmly bound abrasives and simultaneously polishing the back side of the semiconductor wafer using a polishing cloth that is flee of abrasives while providing a polish including abrasives between the back side of the semiconductor wafer and the polishing cloth that is free of abrasives;
   (g) polishing the edge of the semiconductor wafer; and
   (h) polishing the back side of the semiconductor wafer using a polishing cloth including firmly bound abrasives and simultaneously polishing the front side of the semiconductor wafer using a polishing cloth that is free of abrasives while providing a polish including abrasives between the front side of the semiconductor wafer and the polishing cloth that is free of abrasives.

2. The method recited in claim 1, wherein step (a) includes a double-disc grinding procedure.

3. The method recited in claim 1, wherein step (a) is carried out using PPG.

4. The method recited in claim 3, wherein the semiconductor wafer is provided with a rounded edge before the PPG of step (a) is carried out, and wherein the semiconductor wafer is rounded again during step (b) after the PPG step of step (a).

5. The method recited in claim 1, wherein the grinding of the front and back sides in step (c) is carried out sequentially.

6. The method recited in claim 1, wherein step (c) includes using a grinding tool having a grain size of #2000 to #8000.

7. The method recited in claim 1, wherein step (d) includes polishing the front side of the semiconductor wafer.

8. The method recited in claim 1, wherein step (d) includes polishing the back side of the semiconductor wafer.

9. The method recited in claim 1, wherein step (d) includes polishing the front and back sides of the semiconductor wafer.

10. The method recited in claim 1, wherein step (d) includes introducing a polish that is free of solids between the at least one side being polished and the polishing cloth.

11. The method recited in claim 1, wherein the firmly bound abrasives in the polishing cloth used in step (d) are selected from the group consisting of silicon carbide, boron nitride, diamond and oxides of the elements cerium, aluminum, silicon and zirconium.

12. The method recited in claim 11, wherein grain sizes of the abrasives in the polishing cloth used in step (d) are in a range from 0.1μm to 1.0μm.

13. The method recited in claim 1, wherein step (f) provides a material removal on each side of the semiconductor wafer that is at least 0.1 nm and no more than 1μm.

14. The method recited in claim 13, wherein step (f) includes treating the semiconductor wafer with a gaseous medium including hydrogen fluoride and at least one oxidant so as to oxidize a surface of the semiconductor wafer.

15. The method recited in claim 1, wherein step (g) includes centrally rotating the semiconductor wafer and pressing the edge of the semiconductor wafer with a specific force against a centrally rotating polishing drum covered by a polishing cloth containing firmly bound abrasives and continuously supplying a polish solution that is free of solids.

16. The method recited in claim 15, wherein the bound abrasives of the polishing cloth used in step (g) are selected from the group consisting of silicon carbide, boron nitride, diamond and oxides of the elements cerium, aluminum, silicon and zirconium.

17. The method recited in claim 1, wherein the abrasives in the polishing cloth including firmly bound abrasives used in steps (1) and (h) are selected from the group consisting of silicon carbide, boron nitride, diamond and oxides of the elements cerium, aluminum, silicon and zirconium.

18. The method recited in claim 17, wherein the polishing cloth that is free of abrasives used in steps (f) and (h) has a porous matrix.

19. The method recited in claim 1, wherein the polish containing abrasives used in steps (f) and (h) includes particles comprising at least one of the oxides of the elements aluminum, cerium and silicon.

20. The method recited in claim 1, wherein the polish includes colloid-disperse silicic acid.

21. The method recited in claim 1, further comprising a second edge polishing after step (h) so as to provide a two-stage edge polishing procedure.

22. The method recited in claim 21, wherein the second edge polishing includes supplying a polish suspension including abrasives, the polish including at least one of colloid-disperse silicic acid and particles comprising at least one of the oxides of the elements aluminum, cerium and silicon.

23. The method recited in claim 1, further comprising polishing the back side of the semiconductor wafer after step (h), the polishing the back side comprising three steps using a polishing cloth containing an abrasive substance bound in the polishing cloth and pressing the polishing cloth with a polishing pressure onto the back of the semiconductor wafer in each of the three steps, a first of the three steps including introducing a polish free from solids between the polishing cloth and the back side of the semiconductor wafer and providing the polishing pressure in a range of 8 to 15 psi, a second of the three steps including introducing a polish containing abrasives between the back side of the semiconductor wafer and providing the polishing pressure in a range of 8 to 15 psi, and a third of the three steps including introducing a polish containing abrasives between the back side of the semiconductor wafer and providing the polishing pressure in a range of 0.5 to 5 psi.

* * * * *